United States Patent
Prikhodko et al.

(10) Patent No.: US 6,990,323 B2
(45) Date of Patent: Jan. 24, 2006

(54) RF POWER AMPLIFIER CIRCUIT

(75) Inventors: Dmitry Pavlovich Prikhodko, Nijmegen (NL); Albertus Gerardus Wilhelmus Philipus Van Zuijlen, Nijmegen (NL); Niels Kramer, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 498 days.

(21) Appl. No.: 10/270,345

(22) Filed: Oct. 11, 2002

(65) Prior Publication Data

US 2003/0087626 A1 May 8, 2003

(30) Foreign Application Priority Data

Oct. 16, 2001 (EP) ................................. 01203941

(51) Int. Cl.
*H04B 1/04* (2006.01)
(52) U.S. Cl. .................. 455/126; 455/127.1; 330/285; 330/296; 330/298
(58) Field of Classification Search ............. 455/126, 455/127.1, 127.2, 127.3; 330/285, 296, 291, 330/298
See application file for complete search history.

(56) References Cited

U.S. PATENT DOCUMENTS

| | | | |
|---|---|---|---|
| 3,852,669 A | 12/1974 | Bowman et al. ............. | 325/151 |
| 4,041,410 A * | 8/1977 | Belcher ....................... | 330/129 |
| 4,122,400 A | 10/1978 | Medendorp et al. ........ | 330/207 |
| 4,353,037 A | 10/1982 | Miller ......................... | 330/298 |

FOREIGN PATENT DOCUMENTS

JP          03228409 A      9/1991

* cited by examiner

*Primary Examiner*—Lee Nguyen

(74) *Attorney, Agent, or Firm*—Aaron Waxler

(57) ABSTRACT

A RF power amplifier circuit has at least one power transistor and a protection circuit protecting the power transistor against high voltages that lead to a destructive breakdown of the transistor. The circuit comprises a power transistor (2), a biasing circuit (6) biasing the power transistor; a peak detector (8) measuring the output voltage of the power transistor; and a comparator circuit (12) connected to the peak detector (8) and designed to reduce the base current of the power transistor (2) when controlled by the peak detector (8).

14 Claims, 4 Drawing Sheets

RF POWER AMPLIFIER CIRCUIT

The invention relates to a RF power amplifier circuit having at least one power transistor and a protection circuit protecting the power transistor against high voltages that lead to a destructive breakdown of the transistor. Such RF power amplifier circuits are used in the mobile communication technology and are connected to, for example, the antenna of a mobile phone.

The invention further relates to a wireless communication device comprising an RF power amplifier JP 3228409 A discloses a high-frequency power amplifier in which the bias voltages of the power amplifier circuit regulator element are controlled as a result of the detection of the power supply voltage of the power amplifier. By measuring the voltages of the power supply, only indirect information about the voltage at the semiconductor element of the power amplifier can be obtained. Therefore, the protection of the semiconductor element of the power amplifier is critical. Furthermore, this known fact has a negative influence on the total power consumption. Finally, a Zener diode is used, and this adds to the processing cost of the device since it is more difficult and more costly to integrate a Zener diode in the IC within the existing IC production processes.

U.S. Pat. No. 3,852,669 discloses a mismatch protection circuit which protects power transistors of a communication transmitter from damaging excessive reflected power, as might occur when the antenna is disconnected or broken. In this circuit, parameters indicative of forward and reflected power or VSWR (voltage standing wave ratio) are monitored. When there is an excessive mismatch, the DC power supplied to the power transistors is instantaneously cut back to a safe low level. As a feedback control loop is used to adjust only the supply voltage, the protection is an indirect one, and the solution with directional couplers is costly.

U.S. Pat. No. 4,353,037 discloses a protection circuit for a transmitter amplifier which provides power leveling and controls transmitter output power as a function of the ratio of reflected power to forward power. The circuit senses forward power level and develops a first voltage which is compared with the reference voltage to provide a control voltage which controls the power developed by the transmitter amplifier. Reflected power is sensed and a second voltage is developed which is compared with a portion of the first voltage and causes a reduction of the reference voltage when the reflected power to forward power ratio exceeds a predetermined level. Also directional couplers are used for an independent forward and reverse power detection. The detection of excessive forward or reverse power and reducing the power drive supply voltage results in relative high costs for this protective device.

The technical problem addressed by the state of art is to protect the power transistor in the case of mismatch of the load. If the impedance of the antenna is changed, the impedance at the output collector of the power transistor of the power amplifier also changes. The difference in impedance (mismatch) can cause a high VSWR which causes a high voltage on the output collector of the power transistor. This can result in the destructive breakdown of the power transistor.

If a power amplifier can withstand a high VSWR under high power operation, it is called "rugged". The next generation of power amplifiers must have a higher electrical efficiency, and this will be achieved by lowering the output loss. However, this involves an even higher VSWR at the output collector of the power transistor which, in turn, means that the power amplifier will be less rugged. Therefore, without the solution for the ruggedness, higher efficiencies cannot be obtained.

Both circuits of the state of the art are not suited as power amplifiers for telecommunication applications because such power amplifiers operate at frequencies of 1–2 GHz or are based on directional couplers. Such directional couplers have some serious disadvantages because they give rise to efficiency loss. Furthermore, dual directional couplers monitor incident and reflected power. Therefore, under certain mismatch conditions, the signal from a coupler cannot be used to determine the voltage at the output terminal of the power transistor of the power amplifier.

A wireless communication device according to the invention comprises an RF power amplifier circuit having at least one output power transistor and a protection circuit protecting the power transistor against high voltages that lead to a destructive breakdown of the power transistor, the circuit comprising a biasing circuit biasing the power transistor, a peak detector detecting the output voltage of the power transistor, and a comparator circuit connected to the peak detector and designed to reduce the base current of the power transistor when controlled by the peak detector.

Wireless communication devices such as for instance mobile phones rely for their power supply mainly on batteries thus efficiency is extremely important. Furthermore for a reliable operation it is required that the RF power amplifier is capable of handling a mismatch of the load. This is achieved by means of the wireless communication device according to the invention.

It is inter alia an object of the invention to provide a RF power amplifier circuit which has a better ruggedness in combination with an increased efficiency.

In order to achieve the above object, the RF power amplifier circuit comprises an output stage providing the power of the power amplifier; a biasing circuit biasing the power transistor of the output stage; a peak detector measuring the output voltage of the power transistor; and a comparator circuit connected to the peak detector and designed to reduce the base current of the power transistor when controlled by the peak detector.

The circuit of the invention has the advantage that no directional couplers are used and that the peak voltage at the output terminal of the power transistor is detected directly, and that the base current of the power transistor is controlled in accordance with the result of the measurement of the output voltage of the power transistor.

According to an advantageous embodiment of the invention, a RF power amplifier circuit is provided wherein the biasing circuit comprises a voltage-to-current converter and a biasing transistor, the base of the biasing transistor being connected to the comparator circuit. By this circuit arrangement, the base current at the base of the power transistor is controlled directly in relation to the output of the detector, resulting in limiting the peak voltage at the output terminal of the power transistor to an acceptable level.

According to a further advantageous embodiment of the invention, a RF power amplifier circuit is provided wherein the collector of the power transistor is connected to the peak detector. This means that the output voltage of the power transistor is detected directly at the collector terminal which is the acutely endangered point of the circuit to be protected.

According to a further advantageous embodiment of the invention, a RF power amplifier circuit is provided wherein the peak detector is connected to the output collector of the power transistor via a capacitor. This capacitor couples the complete RF output signal to the peak detector.

According to a further advantageous embodiment of the invention, a RF power amplifier circuit is provided wherein the peak detector comprises a diode connected to the capacitor coupling the output signal of the power transistor to the peak detector. This allows measurement of the output level of the power transistor in the peak detector as a DC voltage.

According to a further advantageous embodiment of the invention, a RF power amplifier circuit is provided wherein a capacitor is arranged between the diode and ground in order to smooth the DC voltage in the peak detector.

According to a further advantageous embodiment of the invention, a RF power amplifier circuit is provided wherein the peak detector comprises voltage dividing resistors connected between the capacitor and ground. By designing the values of the resistors in the voltage dividing resistor arrangement, the level can be defined at which level the output power of the output amplifier should be limited.

According to a further advantageous embodiment of the invention, a RF power amplifier circuit is provided wherein one or several resistors of the voltage dividing resistors are adjustable. The voltage limit at the output of the power transistor can thereby be adjusted as required.

According to a further advantageous embodiment of the invention, a RF power amplifier circuit is provided wherein an intermediate node of the voltage dividing resistor arrangement is the output of the peak detector. At this intermediate terminal, a voltage can be derived for the detector, which voltage is suitable for the purpose of being processed by the comparator circuit.

According to a further advantageous embodiment of the invention, a RF power amplifier circuit is provided wherein the comparator circuit comprises a transistor and, in series connection, L-1 diodes 58(1) to 58(L-1) to set the reference voltage in the comparator.

According to a further advantageous embodiment of the invention, a RF power amplifier circuit is provided wherein the comparator circuit is connected via a transistor to the base of the biasing transistor of the biasing circuit to directly control the bias voltage of the power transistor.

According to a further advantageous embodiment of the invention, a RF power amplifier circuit is provided wherein the collector terminal of the input transistor of the comparator circuit is connected to the supply voltage and the emitter is connected to ground through the series of diodes.

According to a further advantageous embodiment of the invention, a RF power amplifier circuit is provided, which amplifies circuit has a plurality of power transistors each connected to a biasing circuit, wherein the output of the peak detector is connected through a comparator circuit and current mirror transistors to the respective biasing circuits of the power transistors. In the case of a plurality of amplifier stages, only one reference circuit comprising several power transistors which are connected to the biasing circuit is necessary. This saves semiconductor elements because the circuit elements for defining the reference voltage are provided only once.

According to a further advantageous embodiment of the invention, a RF power amplifier circuit is provided, which amplifies circuit comprises a switch which is connected between Vsupply and the peak detector, the ON and OFF state of the switch being controlled by Vcontrol. The switch and the capacitance ensures that Isupply is zero when Vsup>0 and Vcontrol=0.

According to a further advantageous embodiment of the invention, a RF power amplifier circuit is provided, which amplifies circuit comprises a filter comprising resistors and a capacitor connected from a node between the resistors to ground, which filter is arranged between the switch and the peak detector to prevent RF injection into the supply line of the power amplifier.

According to a further advantageous embodiment of the invention, a RF power amplifier circuit is provided wherein the circuit runs at 1–2 GHz. It has been found that the advantageous embodiment ensures ruggedness even at higher efficiency levels, which can be achieved in the desired frequency range.

A further understanding of the nature and advantages of the embodiments of the present invention may be realized with reference to the remaining portions of the specification and the drawings in which FIG. 1 shows a RF power amplifier circuit having one power transistor and a protection circuit;

Figure 1:
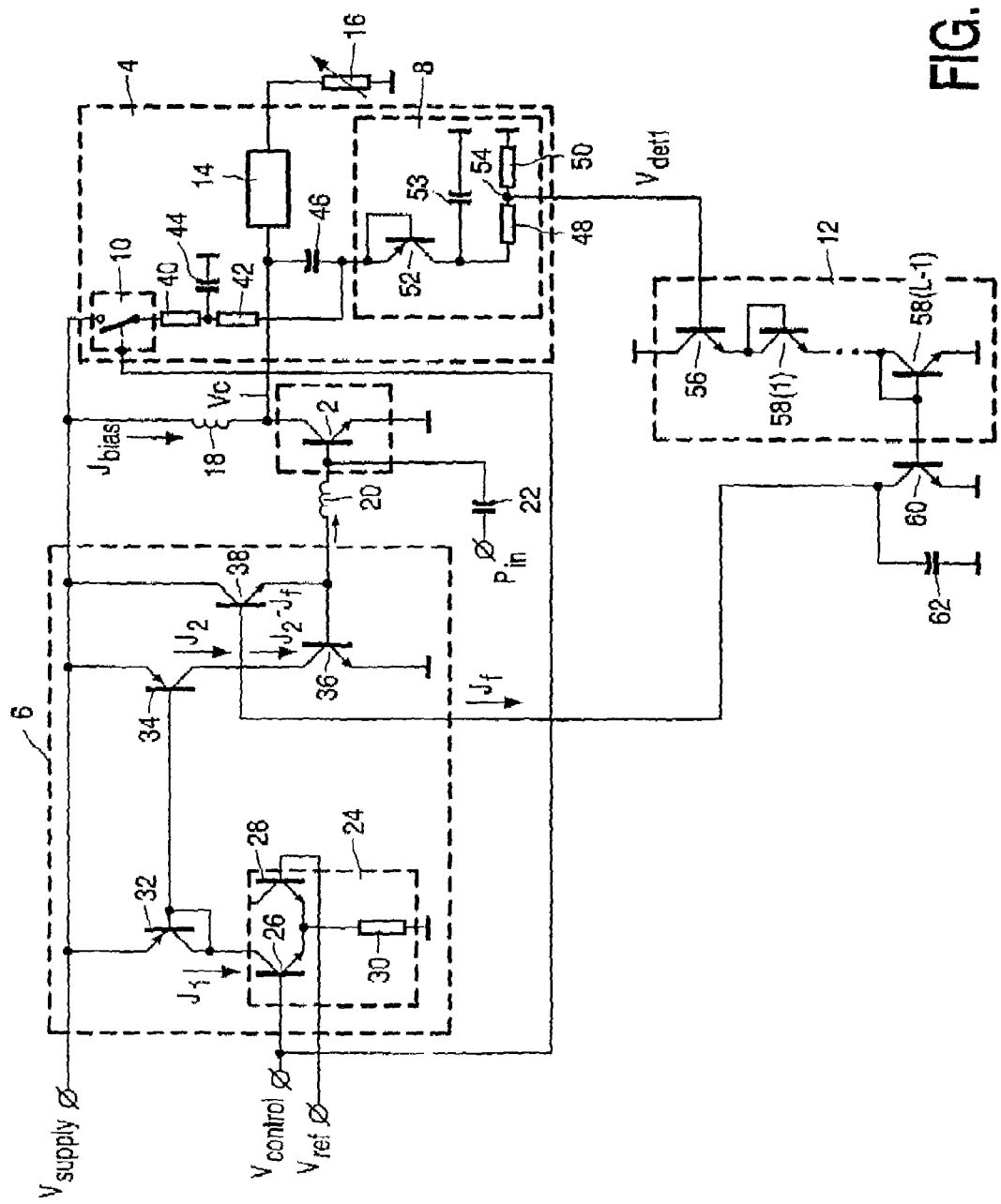

The RF power amplifier circuit of FIG. 1 has a power transistor 2 and a protection circuit 4 protecting the power transistor 2 against high voltages that lead to destructive breakdown of the power transistor 2. The power transistor 2 is biased by a biasing circuit 6 biasing the power transistor 2. The protection circuit 4 comprises a peak detector 8 measuring the output voltage of the power transistor 2, and a switch 10. A control circuit 12 connected to the peak detector 8 is designed to reduce the base current of the power transistor 2 when controlled by the peak detector 8. The output of the output stage is fed through a matching circuit 14 to a load 16, i.e. the antenna. The load has usually 50 Ohms, and it is the purpose of the protection circuit 4 to protect the power transistor 2 against damage if the load is changed and a mismatch is created thereby, which exceeds a certain value.

The collector of the power transistor 2 is connected through an inductor 18 to the supply voltage Vsupply, and the base of the power transistor 2 is connected through an inductor 20 to the biasing circuit 6. The emitter of the power transistor is grounded, and the input signal is fed from the input Pin to the base of the power transistor 2 through a capacitor 22.

The biasing circuit 6 comprises a voltage-to-current converter (VCC) 24 comprising a pair of pnp transistors 26,28, the emitters of which transistors 26,28 are connected in common to ground through a resistor 30. The transistors 26,28 are shown schematically only (the detailed circuitry being omitted for clarity). A control voltage Vcontrol is fed to the base of the transistor 26, whereas a reference voltage Vref is fed to the base of the other transistor 28. The control voltage Vcontrol is a signal controlling the On and OFF state of the switch 10, and this signal indicates, for example in a mobile phone application, whether there is an output required from the power transistor and, if so, how much power is required from the power transistor.

The significant output of the voltage-to-current converter 24, i.e. the current J1, is fed to a current mirror circuit comprising transistors 32,34. Transistor 32 is connected as a diode between the voltage-to-current converter 24 and the supply voltage Vsupply. The base of the transistor 32 is connected to the base of the transistor 34. The emitter of the transistor 34 is connected to Vsupply and the collector of the transistor 34 is connected to ground via a further transistor 36. The base of the transistor 36 is connected to the base of the power transistor 2 through inductance 20. A further transistor 38 is connected between Vsupply and the base of the transistor 36 to have beta compensation even for a large ratio of M (explained below). A signal from the comparator circuit 12, i.e. the current Jf, is fed to the collector of the transistor 36 and the base of the transistor 38.

The switch 10 is connected between Vsupply and the peak detector 8, the ON and OFF state of the switch being controlled by Vcontrol. A filter circuit comprising resistors 40,42 and a capacitor 44 connected from a node between the resistors 40,42 to ground, is arranged between the switch 10 and the peak detector 8 to prevent RF injection into the supply line of the power amplifier.

The collector of the power transistor 2 is connected to the peak detector 8 via a capacitor 46. The peak detector 8 comprises a voltage dividing resistor arrangement comprising resistors 48,50, connected between the capacitor 46 and ground. The voltage dividing resistor arrangement is connected to the capacitor 46 through a diode 52 and to ground through a capacitor 53. An intermediate node 54 of the voltage dividing resistor arrangement is the output of the peak detector 8 to the comparator circuit 12.

The comparator circuit 12 compares the output of the peak detector 8 with a reference voltage. In the embodiment of FIG. 1, the reference voltage Vref is chosen to be L times the base emitter voltage of the power transistor 2. The comparator circuit 12 comprises a transistor 56, the base of which is connected to the output of the peak detector 8 and the emitter of which transistor 56 is connected to Vsupply. The comparator circuit 12 further comprises, in series connection, L-1 diodes 58(1) to 58(L-1). The last diode 58(L-1) of the series forms a current mirror circuit with a transistor 60 where the base of the transistor 60 is connected to the base of the transistor forming the diode 58(L-1), and the emitter of the transistor 60 is connected to the base of the biasing transistor 38 of the biasing circuit 6. The emitter of the transistor 60 is connected to ground through a capacitance 62, which avoids undamped oscillations in the feedback loop (mentioned below) which could occur during the limitation of the voltage at the collector of the power transistor 2.

The diodes of the circuit of FIG. 1 are embodied as bipolar transistors, the base and collectors of which are short-circuited which is advantageous when integrating the circuit on a chip.

The circuit of FIG. 1 operates as follows. A control voltage Vcontrol is applied to the voltage to current converter 24 and transforms into the current I1= (Vcontrol−Vref)/R1, which is mirrored by pnp current mirror transistors 32,34 into I2=N*I1. This current is mirrored again by npn current mirror transistors 36 and 2 into:

$$Ibias = M*I2 = N*M*I1 \quad (1)$$

where N and M are scale ratios. Ibias biases power transistor 2. Such a scaling increases the power added efficiency, which is partly determined by the scale ratios N and M.

Under RF operation, the voltage at the collector of the transistor forming the diode 52 is sensed by the peak detector 8. If Vcontrol>0 then the voltage at the input of the peak detector 8 is the same as the voltage at the collector of the power transistor 2:

$$Vdiode\_int = Vc = Vsupply + Vrf \quad (2)$$

where Vrf is the RF voltage at the collector of transistor 2 and Vsupply is the supply voltage.

The switch 10 and the capacitance 46 serve to satisfy a condition which is important for every power amplifier: When Vsup>0 and Vcontrol=0, then Isupply has to be zero. In the circuit of FIG. 1, the switch 10 feeds Vsupply to the input of the peak detector 8 when Vcontrol>0, and the capacitance 46 feeds the RF-signal to the input of the peak detector 8 and rejects Vsupply. When Vcontrol=0, the switch 10 is off and no current is flowing through the peak detector 8.

The output of the peak detector 8 is a low-frequency signal $$Vdet = k*Vdiod\_int = k*Vc \quad (3)$$

where k is a rectification coefficient between 0.9 and 1. This signal is divided by the resistive divider comprising the resistors 48,50 and Vdet1 is output and then compared with a reference voltage in the comparator circuit 12. The preference voltage is equal to 1*Vbe, where 1=1 . . . L is the number of transistors connected in series in the comparator circuit 12.

$$Vdet1 = k*Vc*R5/(R4+R5) \quad (4)$$

If, at the certain collector voltage (Vc_max), Vdet1_max exceeds 1*Vbe, then a feedback loop comprising the power transistor 2, the peak detector 8, the comparator 12 and part of the biasing circuit 6 generates the current If which is subtracted from I2, reducing Ibias and forcing $$Vdet1\_max = 1*Vbe \quad (5)$$

Substituting (4) in (5) results in:

$$Vc\_max = 1*Vbe*(1+R4/R5)/k \quad (6)$$

By choosing an appropriate number (1) of the transistors in the comparator circuit 12 and an appropriate ratio of the resistor 48 to the resistor 50, the voltage at the collector of the power transistor 2 can be effectively limited and the power amplifier can be held in a safe operation area, preventing breakdown through high voltage at the collector of the power transistor 2. Coupled with Vbe such a limitation of the voltage at the collector of the power transistor 2 has the advantage that Vbe has the same temperature tendency as the breakdown voltage BVcb0.

Figure 2:
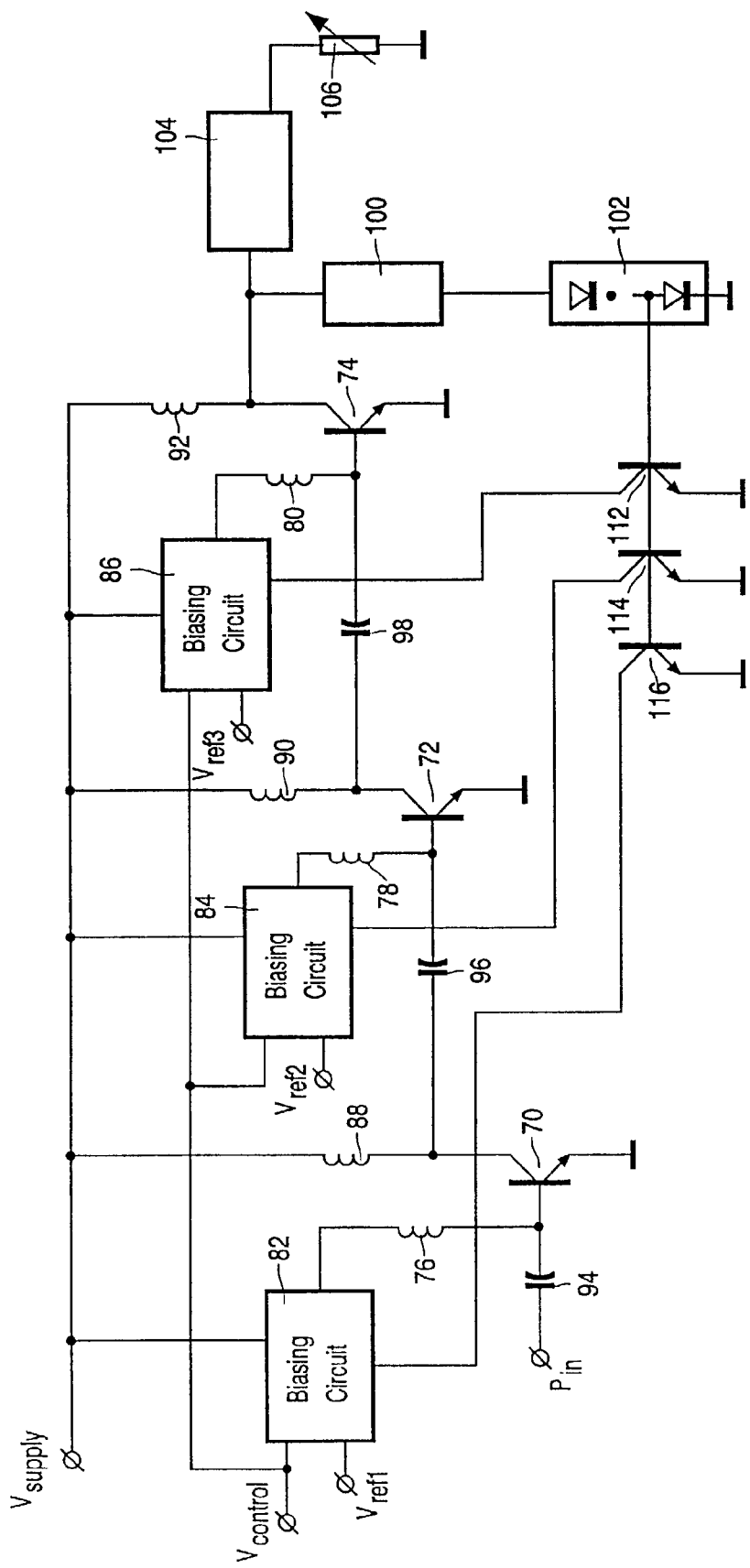
FIG. 2 shows a RF power amplifier circuit having three stages and a protection circuit.

FIG. 2 shows an embodiment of the RF power amplifier circuit used in mobile communication and having three power amplifier stages each comprising a power transistor 70,72,74 respectively, the base electrodes of which power transistors are each connected through inductors 76,78,80 to outputs of biasing circuits 82, 84,86 and the collectors of which power transistors are each connected through further inductors 88,90,92 to a supply voltage Vsupply output by the biasing circuits 82,84,86. The biasing circuits 82,84,86 are designed similarly as the biasing circuit 6 of FIG. 1. The input signal is input to the power transistors 70, 72, 74 from an input terminal Pin through a capacitor 94 to the base of the transistor 70, through a capacitor 96 from the collector of transistor 70 to the base of the transistor 72, and through a capacitor 98 from the collector of transistor 72 to the base of the transistor 74. The output of the output power transistor 74 is connected to a comparator circuit 102 through a control circuit 100. The peak detector in the control circuit 100 is connected to the collector of the power transistor 74. The collector of the power transistor is also connected through matching circuit 104 to the load (antenna) 106.

Voltages Vref1, Vref2, Vref3 determine the opening of each stage as a function of Vconrol. Voltage at the collector of power transistor 74 is sensed by the control circuit (FIG. 1) and if, during mismatch, the detected and divided voltage exceeds the reference voltage (1*Vbe) of the comparator circuit 102, then transistors 112, 114 and 116 which are controlled by the output of the comparator circuit 102 will adjust current in the biasing circuits 82,84,86, respectively, in such a way that the voltage at the collector of the power transistor 74 will be limited according to the equation (6) above.

Figure 3:
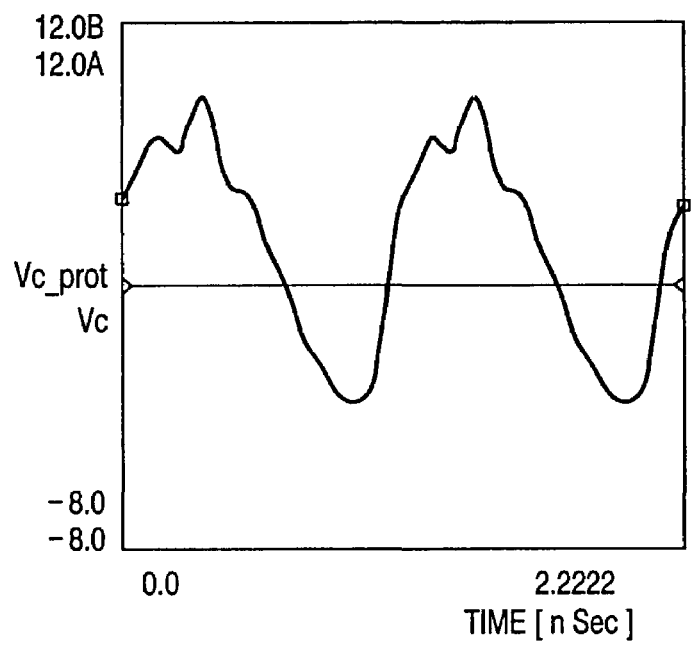
FIG. 3 is a graphical representation of a collector voltage of a power amplifier transistor versus time.

FIG. 3 shows the collector voltage VC of the power transistor 2 of FIG. 1 with a protection circuit according to the invention as Vc_prot and without the protection circuit of the invention as Vc at nominal conditions, i.e. 50 Ohm load and Vsupply=3,5 V. The two curves are identical to the extent that no differences can be seen in this graphical representation. This means that the protection circuit does not influence the operation of the RF power amplifier under nominal conditions.

Figure 4:
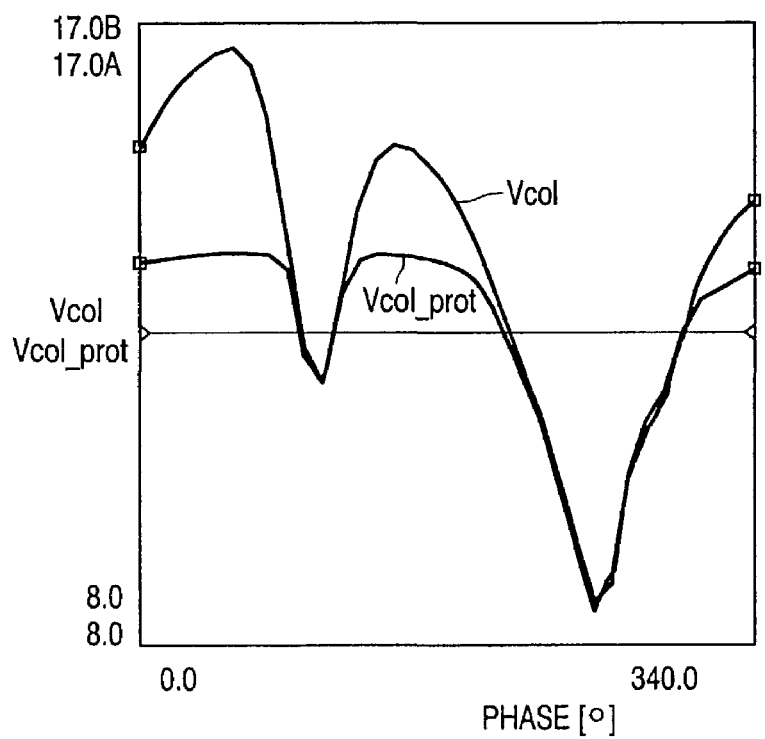
FIG. 4 is a graphical representation of a collector voltage of a power amplifier transistor versus phase of the signal.

FIG. 4 shows the voltage at the collector of the power transistor 2 with the protection circuit of the invention as Vcol_prot and without the protection circuit of the invention as Vcol versus the phase of the signal in a mismatch situation where the mismatch is 1:12. In a nominal condition, where the load is 50 Ohm, a mismatch of 1:12 can mean 50:12=4,17 Ohm or 50×12=600 Ohm.

Figure 5:
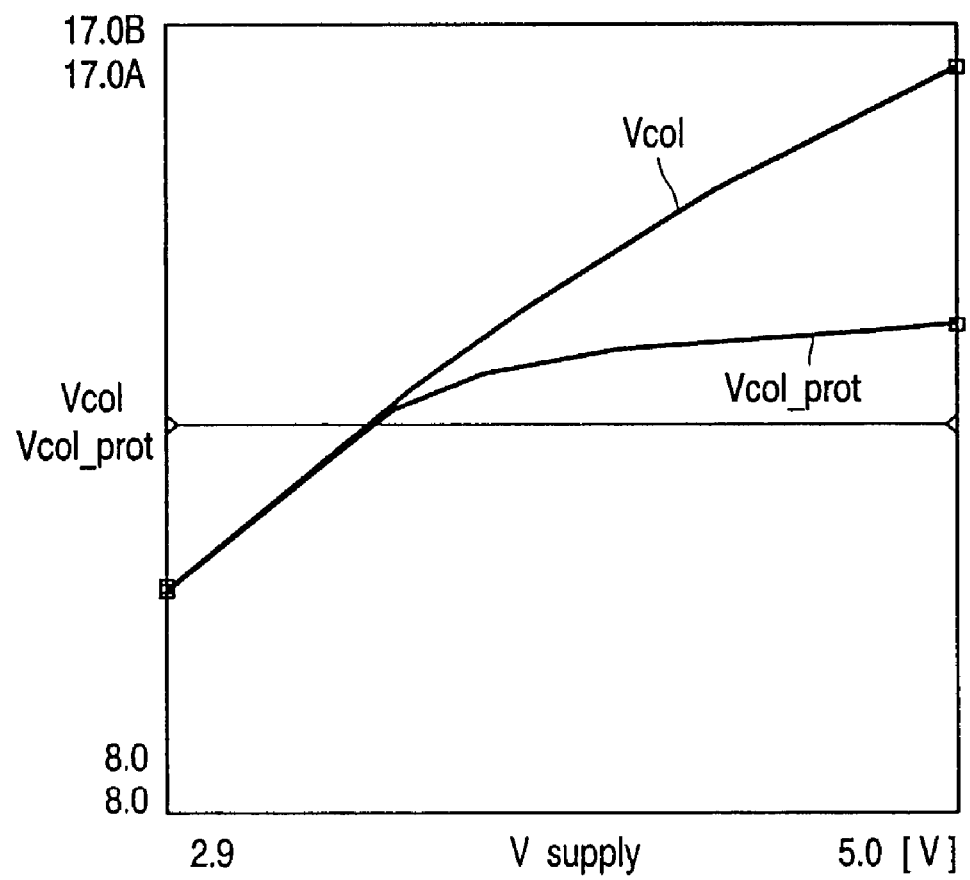
FIG. 5 is a graphical representation of a collector voltage of a power amplifier transistor versus supply voltage of the transistor.

FIG. 5 shows the voltage at the collector of the transistor 2 with a protection circuit 10 of the invention as Vc_prot and without the protection circuit 10 of the invention as Vcol for different supply voltages in a mismatch situation where the mismatch is 1:12.

It can be seen from FIGS. 4 and 5 that, in the particular circuit used to produce the graphs of FIGS. 4 and 5, the collector voltage of the power transistor 2 was limited to about 13 V. Any voltages above this level are cut off by means of the protection circuit 10.

It is to be understood that the above description is intended to be illustrative and not restrictive. Many embodiments will be apparent to those skilled in the art upon reviewing the above description. The scope of the invention should, therefore, be determined not as reference to the above description, but should instead be determined with reference to the appended claims along with the full scope of equivalence to which such claims are entitled.

What is claimed is:

1. A RF power amplifier circuit having at least one output power transistor and a protection circuit protecting the power transistor against high voltages that lead to a destructive breakdown of the power transistor, the circuit comprising:
  (a) a biasing circuit (6) comprising a voltage-to-current convener and a biasing transistor, said biasing circuit biasing the power transistor (2);
  (b) a peak detector (8) detecting the output voltage of the power transistor, and
  (c) a comparator circuit (12) connected to the peak detector (8) and designed to reduce the base current of the power transistor (2) when controlled by the peak detector.

2. The RF power amplifier circuit of claim 1, wherein the collector of the power transistor (2) is connected to the peak detector (8) via a capacitor (46).

3. The RF power amplifier circuit of claim 1, wherein the peak detector (8) comprises a diode (52) connected to a capacitor (46) coupling the output signal of the power transistor (2) to the peak detector (8).

4. The RF power amplifier circuit of claim 3, wherein a capacitor (53) is arranged between the diode (52) and ground.

5. The RE power amplifier circuit of anyone of the claim 1, wherein the peak detector (8) comprises voltage dividing resistors (48,50) connected between the capacitor (46) and ground.

6. The RF power amplifier circuit of claim 5, wherein one or several resistors of the voltage dividing resistors arc adjustable.

7. The RF power amplifier circuit of claim 5, wherein an intermediate node of the voltage dividing resistor arrangement is the output of the peak detector.

8. The RF power amplifier circuit of claim 1, wherein the comparator circuit (12) comprises a transistor (56) and, in series connection, L-1 diodes 58(1) to 58(L-1).

9. The RF power amplifier circuit of claim 1, wherein the comparator circuit (12) is connected via a transistor (62) to the base of the biasing transistor (38) of the biasing circuit (6).

10. The RF power amplifier circuit of claim 1, wherein the collector terminal of the input transistor (56) of the comparator circuit (12) is connected to the supply voltage and the emitter is connected to ground through the series of diodes.

11. The RF power amplifier circuit of claim 1, having a plurality of power transistors (70,72,74) each connected to a biasing circuit (82,84,86), wherein the output of the peak detector comprised in a control circuit (100) is connected through a comparator circuit (102) and current mirror transistors (112, 114, 116) to the respective biasing circuits (82,84,86) of the power transistors (70,72,74).

12. The RF power amplifier circuit of claim 1, comprising a switch (10) which is connected between Vsupply and the peak detector (8), the ON and OFF state of the switch being controlled by Vcontrol.

13. The RF power amplifier circuit of claim 1, comprising a filter comprising resistors (40,42) and a capacitor (44) connected from a node between the resistors (40,42) to ground, which filter is arranged between the switch (10) and the peak detector (8).

14. A wireless communication device comprising an RF power amplifier circuit having at least one output power transistor and a protection circuit protecting the power transistor against high voltages that lead to a destructive breakdown of the power transistor, the circuit comprising:
  (a) a biasing circuit (6) comprising a voltage-to-current converter and a biasing transistor, said biasing the power transistor (2);
  (b) a peak detector (8) detecting the output voltage of the power transistor; and
  (c) a comparator circuit (12) connected to the peak detector (8) and designed to reduce the base current of the power transistor (2) when controlled by the peak detector.

* * * * *